(12) United States Patent
Wang et al.

(10) Patent No.: US 8,580,683 B2
(45) Date of Patent: Nov. 12, 2013

(54) APPARATUS AND METHODS FOR MOLDING DIE ON WAFER INTERPOSERS

(75) Inventors: Chung Yu Wang, Hsin-Chu (TW); Chih-Wei Wu, Zhuangwei Township (TW); Szu Wei Lu, Hsin-Chu (TW); Jing-Cheng Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/246,556

(22) Filed: Sep. 27, 2011

(65) Prior Publication Data

US 2013/0075937 A1 Mar. 28, 2013

(51) Int. Cl.
*H01L 23/28* (2006.01)

(52) U.S. Cl.
USPC .......................................... 438/667; 257/782

(58) Field of Classification Search
USPC ......................................................... 438/667
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Sliwa, Jr. | |
| 5,075,253 A | 12/1991 | Sliwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |

(Continued)

*Primary Examiner* — Zandra Smith
*Assistant Examiner* — Damian A Hillman
(74) *Attorney, Agent, or Firm* — Slater & Matsil, L.L.P.

(57) ABSTRACT

Methods and apparatus for performing molding on die on wafer interposers. A method includes receiving an interposer assembly having a die side and an opposite side including two or more integrated circuit dies mounted on the die side of the interposer, the interposer assembly having spaces formed on the die side of the interposer between the two or more integrated circuit dies; mounting at least one stress relief feature on the die side of the interposer assembly in one of the spaces between the two or more integrated circuit dies; and molding the integrated circuit dies using a mold compound, the mold compound surrounding the two or more integrated circuit dies and the at least one stress relief feature. An apparatus is disclosed having integrated circuits mounted on a die side of an interposer, stress relief features between the integrated circuits and mold compound over the integrated circuits.

16 Claims, 6 Drawing Sheets

(56) References Cited

U.S. PATENT DOCUMENTS

| | | |
|---|---|---|
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,393,580 B2 * | 7/2008 | Kanda ............................ 428/209 |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,605,019 B2 | 10/2009 | Simon et al. |
| 7,763,965 B2 * | 7/2010 | Webb ............................ 257/687 |
| 7,834,450 B2 | 11/2010 | Kang |
| 7,858,499 B2 | 12/2010 | Plaut et al. |
| 7,948,071 B2 | 5/2011 | Thomas et al. |
| 2011/0285005 A1 * | 11/2011 | Lin et al. ....................... 257/686 |
| 2012/0098123 A1 * | 4/2012 | Yu et al. ........................ 257/737 |

* cited by examiner

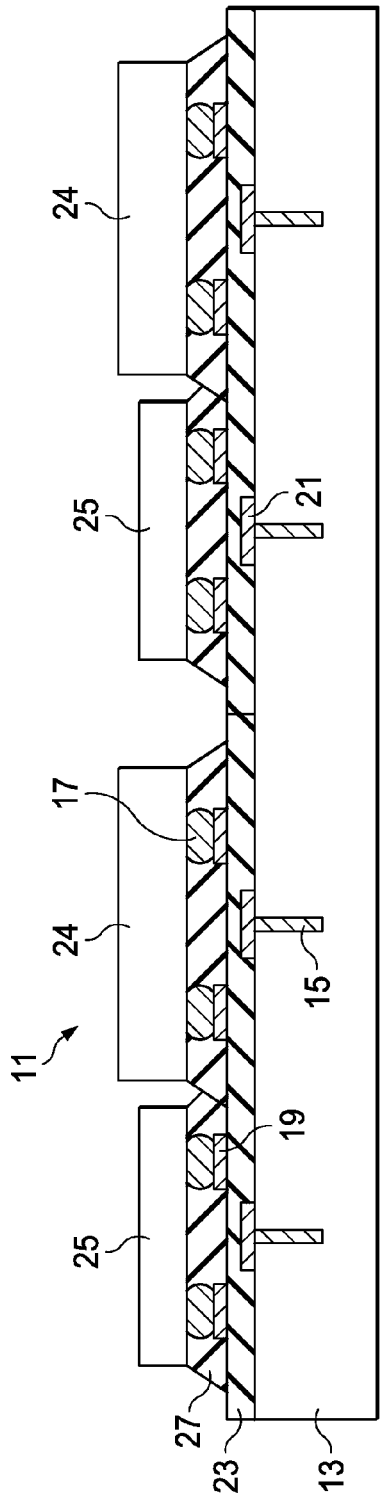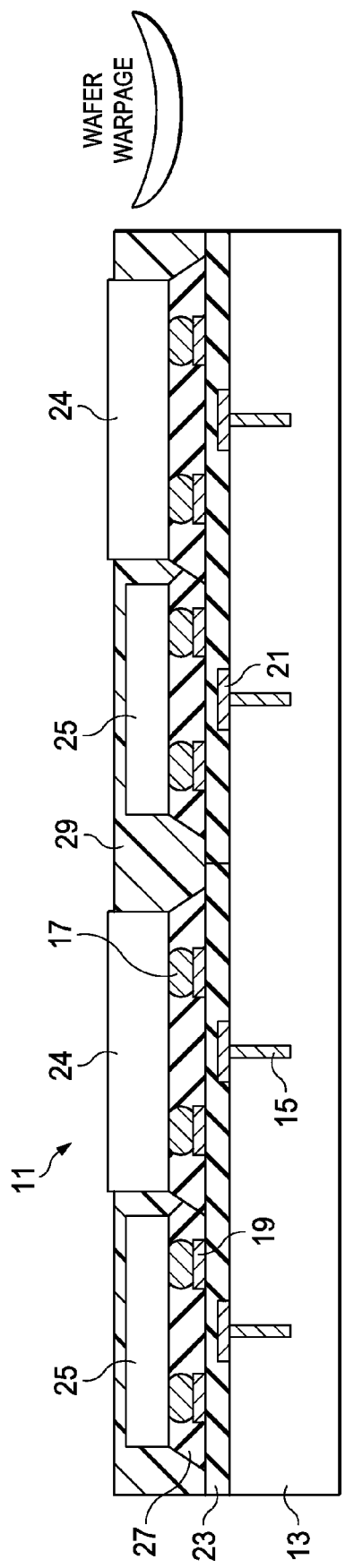

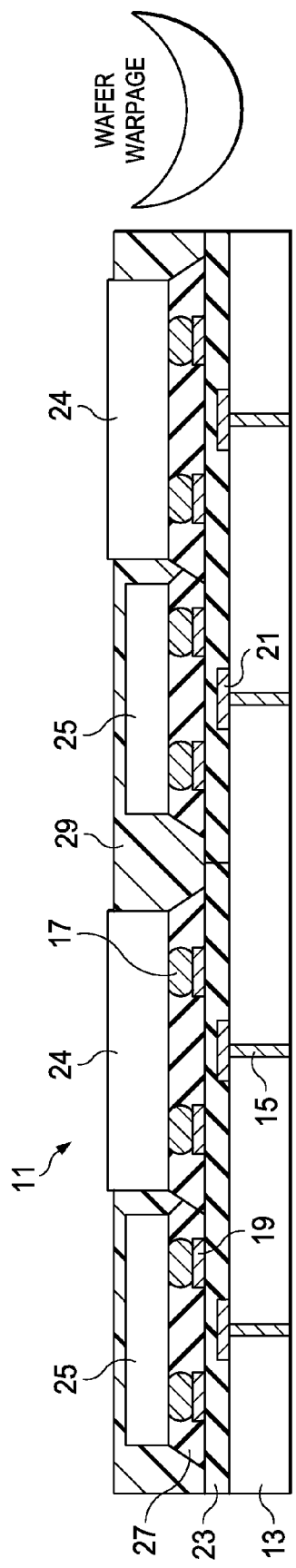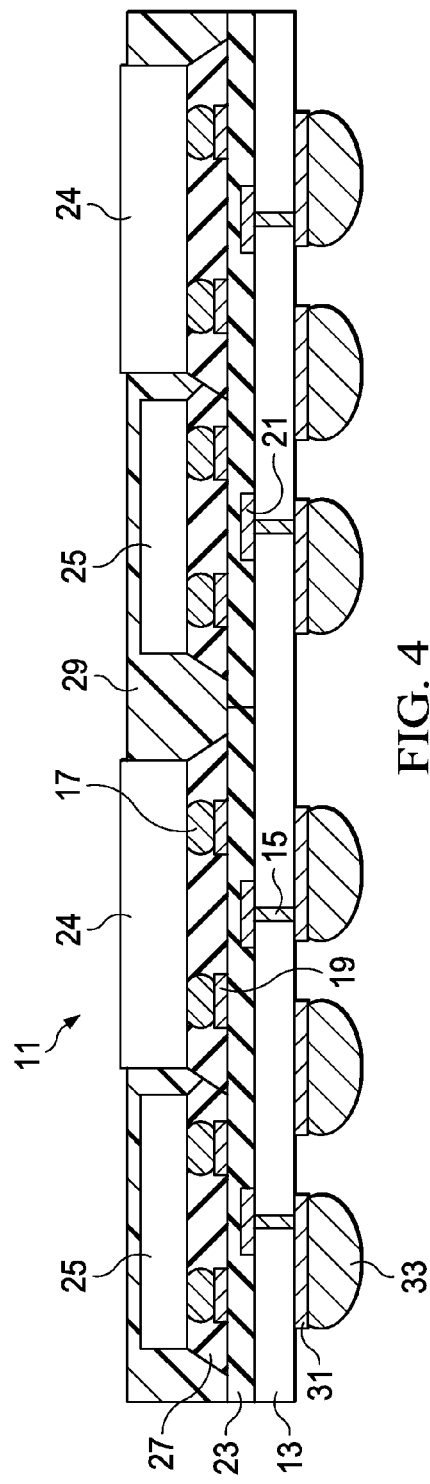

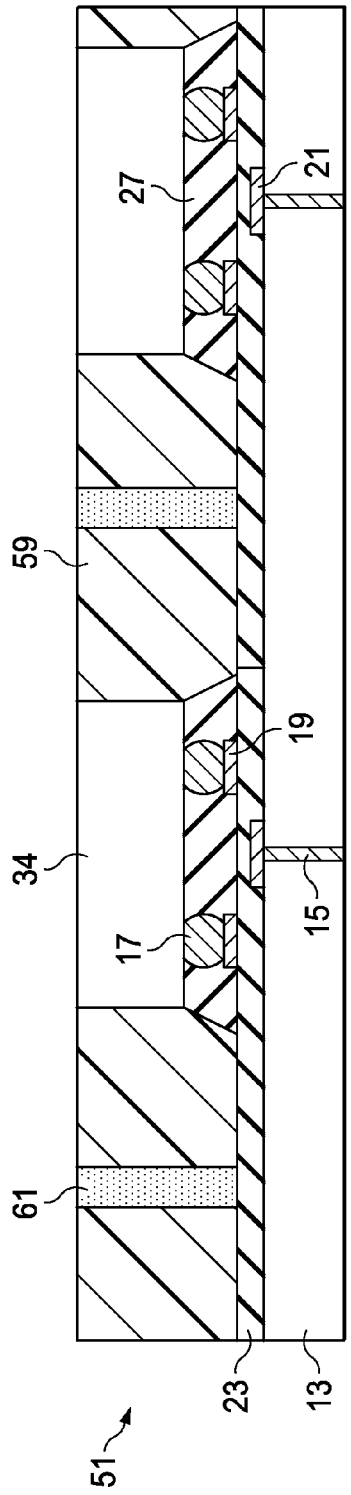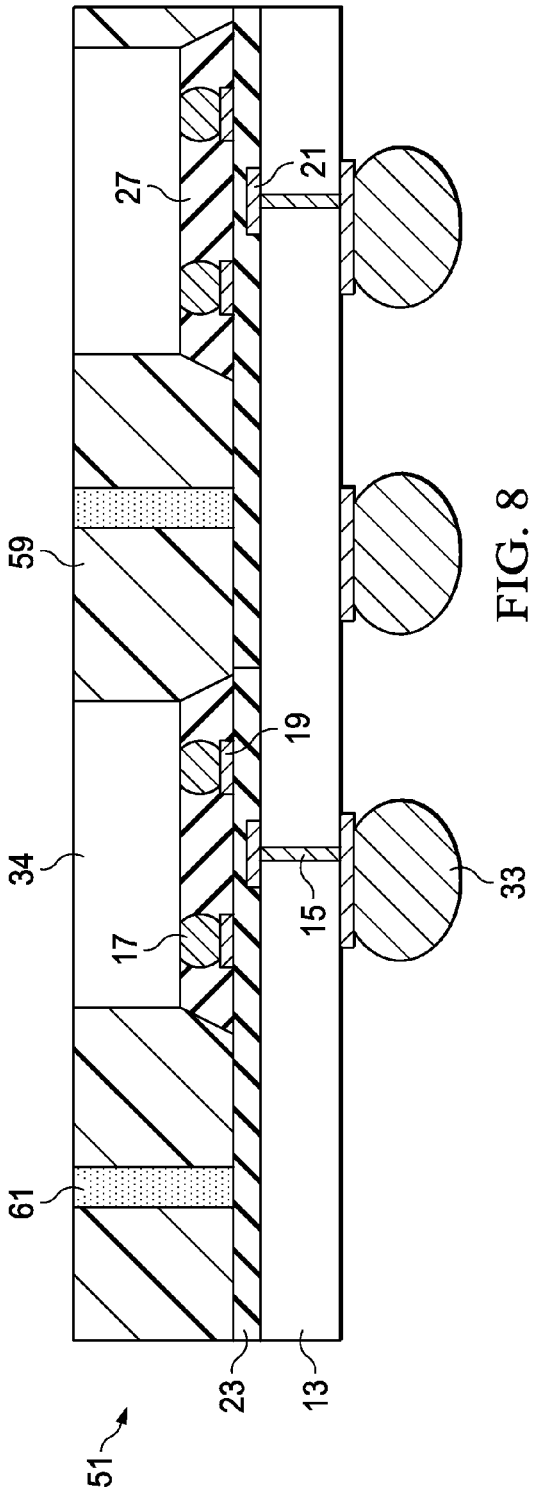

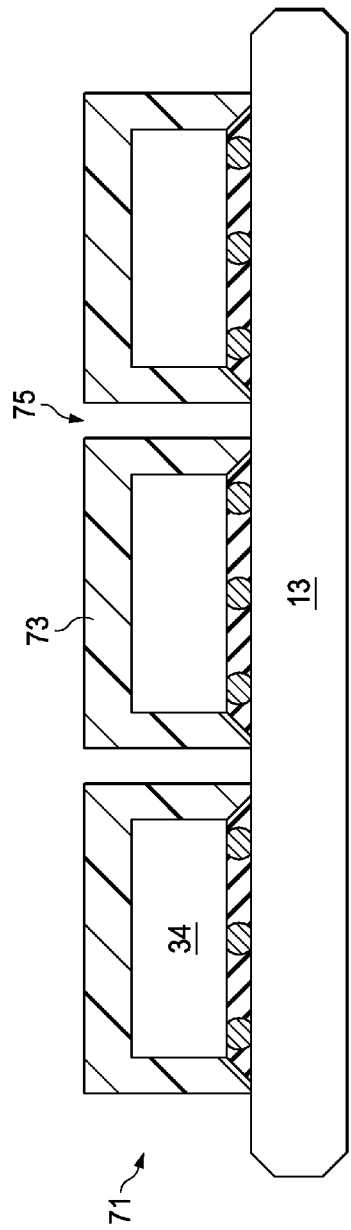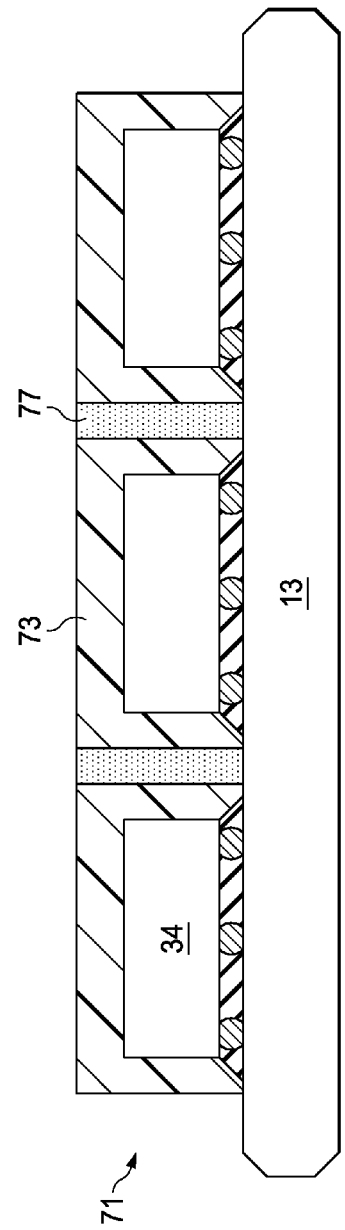

APPARATUS AND METHODS FOR MOLDING DIE ON WAFER INTERPOSERS

RELATED APPLICATIONS

This application is related to the U.S. application Ser. No. 13/176,606, filed on Jul. 5, 2011, entitled "Apparatus and Methods for Dicing Interposer Assembly," which is hereby incorporated in its entirety herein by reference.

BACKGROUND

A common requirement of current integrated circuit manufacturing and packaging is the use of interposers to receive single or multiple integrated circuit dies. The use of through vias or through silicon vias ("TSVs") extending through the interposers is increasing. These through vias allow electrical coupling between integrated circuit dies and components mounted on one side of an interposer, and terminals such as solder balls mounted on the opposite side of the interposer. Further, the use of TSV technologies with silicon interposer substrates enable wafer level processing ("WLP") of the interposer assemblies. This technique is increasingly applicable to increasing memory or storage device density, for example, without added circuit board area. As demand for hand held and portable devices such as smart phones and tablet computers increases, board area and board size restrictions also increases, and the use of the interposer assemblies and TSVs can meet these requirements. These techniques apply to semiconductor wafers such as silicon wafers, but may also apply to other interposer materials, for example BT resin and other interposer materials, where through via connections, conductive patterning for connecting components, and component mounting may be performed.

During processing of the dies mounted on the wafer interposer, which may be referred to as a "die on wafer" ("DOW") assembly, a molding step may be performed to form a mold compound surrounding the individual integrated circuit die components. The mold compound may be partially removed from the top of the die side to expose the upper surface of the integrated circuit dies.

Using conventional plastic mold compound on the dies in a conventional compression molding process on the silicon wafer interposer results in some wafer warp. This warp can become even greater when the wafer is then subsequently thinned to complete the TSVs. The molding is performed to surround the ICs with the plastic mold compound, and then the silicon wafer is thinned in a backgrinding operation to expose the opposite end of the TSVs. Because the semiconductor wafer interposer is now very thin, the wafer warp already present after molding can increase greatly after the wafer thinning operation. Subsequent wafer process steps that rely on a planar exterior surface of the assembly, such as vacuum tools used for pick and place in the solder ball bumping process, cannot work reliably on the warped wafer interposers. This reduces yield and can result in the waste of the mounted integrated circuit dies, which are known good dies ("KGDs"), and loss of the KGDs greatly increases costs. Rework or manual intervention into the processing may be required when automated processes cannot handle the warped wafer interposers.

A continuing need thus exists for methods and systems to efficiently perform molding for DOW interposer assemblies without the warp and the attendant problems experienced when using the known methods.

BRIEF DESCRIPTION OF THE FIGURES

For a more complete understanding of the present embodiments, and the advantages thereof, reference is now made to the following descriptions taken in conjunction with the accompanying drawings, in which:

FIG. 1 depicts in a cross-section an illustrative assembly in an intermediate process for use with the embodiments;

FIG. 2 depicts in a cross-section the assembly of FIG. 1, following additional processing;

FIG. 3 depicts in a cross-section the assembly of FIG. 2, following additional processing;

FIG. 4 depicts in a cross-section the assembly of FIG. 3, following additional processing;

FIG. 7 depicts in a cross-section the embodiment assembly of FIG. 6(?) following additional processing;

FIG. 8 depicts in a cross-section the embodiment of FIG. 7 when completed;

FIG. 9 depicts in a cross-section an alternative embodiment in an intermediate stage of processing;

FIG. 10 depicts in a cross-section the embodiment of FIG. 9, following additional processing;

Figure 5:
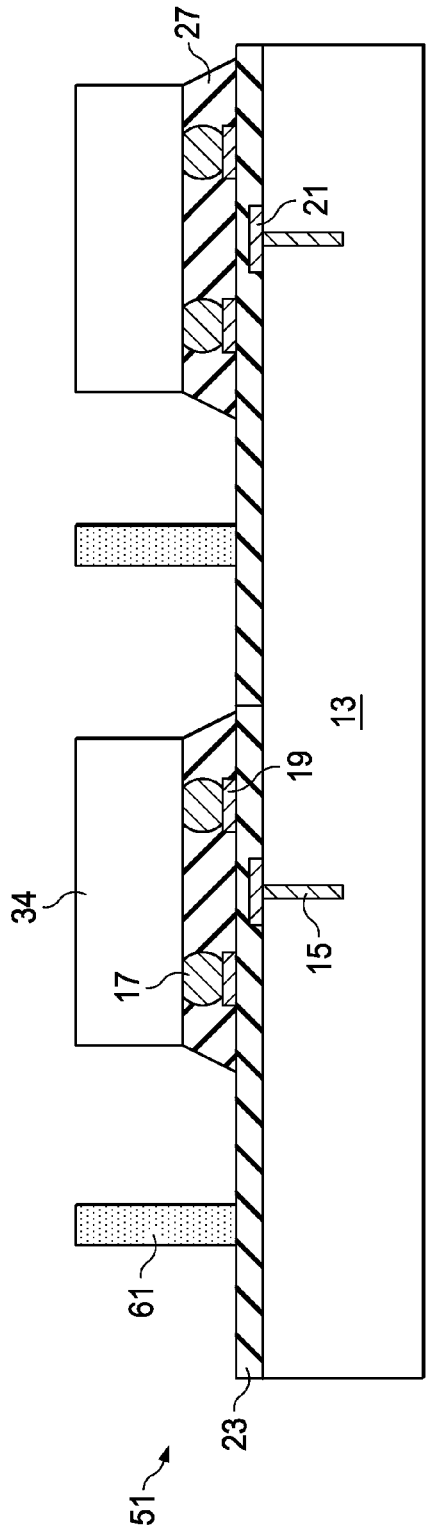
FIG. 5 depicts in a cross-section an embodiment assembly in an intermediate stage of processing.

The drawings, schematics and diagrams are illustrative and not intended to be limiting, but are examples of embodiments of the invention, are simplified for explanatory purposes, and are not drawn to scale.

DETAILED DESCRIPTION

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments or the claims.

Embodiments of the present application which are now described in detail provide novel methods and apparatus embodiments for manufacturing die on wafer ("DOW") assemblies with molding efficiently by providing methods and apparatus to reduce wafer warp during molding and in subsequent wafer thinning and bumping operations. By providing methods and apparatus to perform the molding and subsequent processing with reduced wafer warp, the silicon wafer interposer operations such as solder ball bumping can be effectively performed using automated handling mechanisms. The loss of KGD IC devices in the thinning and subsequent bumping operations that occurs using prior known methods is reduced or eliminated, yield is increased and accordingly, the unit costs are lowered.

In order to illustrate the embodiments and their operation, example DOW assembly process steps are first described. These are simplified and illustrative only and do not limit the embodiments or the scope of the claims, and these examples are presented for explanation and understanding of the embodiments.

FIG. 1 depicts in a cross-section an interposer assembly 11. In FIG. 1, substrate 13 is depicted. This substrate may be a silicon wafer, a semiconductor substrate, or another substrate material for interposers. Typically silicon wafers are used. Substrate 13 has a die side, here shown as the upper side, and an opposite side (here shown as the bottom side) for receiving connections for system connection as is described later.

Through silicon vias ("TSVs") 15 are shown extending vertically into substrate 13 from the die side of the substrate. These are formed as "blind vias" using photolithography, developing, patterning, etching, and electroplating steps. For example, the TSVs may be completed using copper or another conductor material electroplated into the vias. Barrier layers and seed layers may be used. The pads 21 that overlie the vertical TSVs 15 may couple the TSVs one to another, or, may be used to couple to the integrated circuits (not shown) that will be mounted in a later step.

A passivation layer 23 is formed over substrate 13. Microbump connections are formed. The microbumps 17 are formed over under bump metallization ("UBM") 19. The microbumps 17 may be formed of solder including lead based solder or lead free solder, typically eutectic materials such as SnAg (SAC) or SnAgCu ("SAC") may be used for lead free applications. These materials form a compound with a melting point that is compatible with solder reflow steps, as are known in the art. Integrated circuit dies 24 and 25 are shown mounted to the microbumps 17 on the die side of the substrate. Note that these ICs may be of different types and may therefore have different thicknesses, as shown in the figure. However this is only one example and ICs 24 and 25 can be of the same type, and have the same thickness, as well. The ICs 24 and 25 may have a thickness up to 600 microns, for example. An underfill 27 is applied after the ICs are mounted in a solder reflow operation that melts the microbumps to form physical and electrical connection to substrate 13. The underfill 27 protects the microbumps 17 during processing and in the system, during thermal stress. The ICs 24 and 25 may be coupled one to another electrically to form a system, although this is not necessary in all applications where the embodiments are used.

FIG. 2 depicts in another cross-sectional view the interposer assembly 11 following additional processing steps. Substrate 13 is subjected to a molding operation. In the molding operation, a plastic mold compound 29 is formed over the integrated circuit dies 24 and 25 and substrate 13. In a compression molding process, a liquid type thermoset epoxy resin mold compound may be used in a compress molding machine, the mold compound may be heated to an elevated temperature where it becomes a lower viscous liquid, and forced under compression into a cavity where the interposer assembly 11 is placed, the mold compound surrounding the integrated circuit dies 24 and 25 and the die side of substrate 13. The mold compound solidifies when cooled and is then released from the compress molding machine.

The mold compound forms a uniform matrix of material extending across the interposer assembly 11. Because it shrinks and expands when heated and cooled, as it cools, some wafer warp of substrate 13 may occur. This is shown in FIG. 2. For example, when using a 300 millimeter wafer, a 1000 micron warp has been observed in a conventional molding operation.

After the mold compound is cured, the mold compound may be partially removed in a top grinding operation to expose the upper surfaces of the thicker of the integrated circuit dies on the die side of substrate 13. FIG. 2 depicts the interposer assembly 11 after the top grinding operation has exposed the top of the integrated circuit dies 24, for example.

Following a cure cycle for the mold compound 29, a wafer thinning operation is performed. FIG. 3 depicts the interposer assembly 11 after substrate 13 is thinned by a backgrinding operation. The backgrinding operation is performed on the opposite, or solder bump side of substrate 13, and not the die side. (This is the bottom surface of substrate 13 in FIG. 3.) The thinning continues through physical grinding and/or chemical etching until the bottom ends of the TSVs 15 are exposed on the bottom surface of substrate 13, as shown in FIG. 3. Following the backgrinding operation, substrate 13 may be thinned to a thickness between 100-200 microns, as a non-limiting example. Substrate 13 may be thinned to as little as 100 microns.

Following the backgrinding process, substrate 13 may experience an increase in the wafer warp. This is illustrated in FIG. 3. The increase is due to the warp of the mold compound 29 applied against what is now a very thin substrate. While the initial warp may have been slight, following the wafer thinning by a backgrinding process, the warp may become substantial. This warp can be so large as to make the use of vacuum tools to perform pick and place operations by making contact to the die side or opposite side surface of substrate 13 impossible. The warp may cause the vacuum tools to break suction and not be able to transport the wafer to the subsequent processing stations.

FIG. 4 depicts in a cross-section the interposer assembly 11 following a solder bumping or solder ball step. C4 solder bumps or solder balls 33 may be formed on the opposite or connection side of substrate 13. The integrated circuit dies 24 and 25, the mold compound 29, substrate 13, the through vias 15 and other elements of FIG. 4 are as shown in FIG. 3. The C4 solder bumps 33 are then used to make the external or system connections when the interposer assembly 11 is mounted to a circuit board or card. However, if the wafer warp (as shown in FIG. 3) is too great, as has been observed in conventional molding operations, then the subsequent processing steps cannot be performed. Conventional molding and backgrinding of the interposer assembly 11 may therefore not result in a correctly completed assembly.

FIG. 4 depicts in another cross-section the interposer assembly 11 following an additional process step. Solder balls or C4 solder bumps 33 are now shown disposed on the solder bump side (here, the bottom surface) of substrate 13, with the integrated circuit dies 24 and 25 disposed on the die side of substrate 13, (here the top surface). The solder bumps 33 are coupled to at least some of the TSVs 15 and are formed on pads 31 overlying the TSVs. The bottom surface of substrate 13 may have a redistribution layer ("RDL") forming connections that run horizontally and map the solder balls to different TSVs, to provide flexibility in the solder ball placement. The solder bumps 33 may be a lead based, or lead free solder, and are compatible with solder reflow processes that will be used later to mount the interposer assemblies to a mother board, system board or the like in the target system. The pads 31 may have various plating treatments to increase adhesion, provide diffusion barriers, prevent oxidation, and increase solderability, including nickel, gold, platinum, palladium, copper, and their alloys, and including such treatments as electroless nickel immersion gold ("ENIG"), electroless nickel electroless palladium immersion gold ("ENEPIG") and the like.

FIG. 5 depicts in a cross-section an embodiment interposer assembly 51 at an intermediate processing step. The interposer assembly 51 includes integrated circuit dies 34 mounted on the die side of substrate 13; again, this may be a semiconductor wafer and in some embodiments a silicon wafer is used. Silicon through vias 15 are formed from the die side and extend into substrate 13. An underfill 27 is used to protect the microbumps 17 that are formed on pads of UBM 19 over substrate 13. In addition, stress relief features 61 are formed on the die side of the substrate 13. These stress relief features may be considered to be "dams" that will form a wall between the integrated circuit dies. The stress relief features extend horizontally on the die side surface of substrate 13 and may run alongside the integrated circuit dies in parallel with the dies, for example, and may run in one or two directions, forming rows or columns, or forming a grid surrounding the integrated circuit dies on each side. The stress relief features 61 have a vertical thickness that may be as much as, or somewhat less than, the die thickness of the thickest integrated circuit dies. This may be, for example, up to 600 microns. The material for the stress relief features 61 may be selected from various materials compatible with wafer level processing and packaging, but it should have a high coefficient of thermal expansion ("CTE") and a low modulus. The material may be organic or inorganic. B-stage film or liquid epoxies and resins, "glob-top" material and the like may be used. The stress relief material will be different from the mold compound material so that during the molding operation, it breaks the matrix that would otherwise form as a continuous matrix in the mold compound. Without the use of the stress relief material, the continuous matrix in the mold compound would extend all the way across substrate 13. Such a continuous matrix can create a substantial force that is believed to cause the wafer warp in the prior methods. By breaking up the mold compound matrix using the stress relief features, the wafer warp is reduced or eliminated.

The stress relief features 61 may be applied as a B-stage film or dispensed as a liquid material such as an epoxy or resin. A pre-cure may be performed to cure the stress relief material; alternatively, it may be cured with the mold compound in a single curing step. Preform fixtures of the stress relief material may be formed and mounted on substrate 13.

Figure 6:
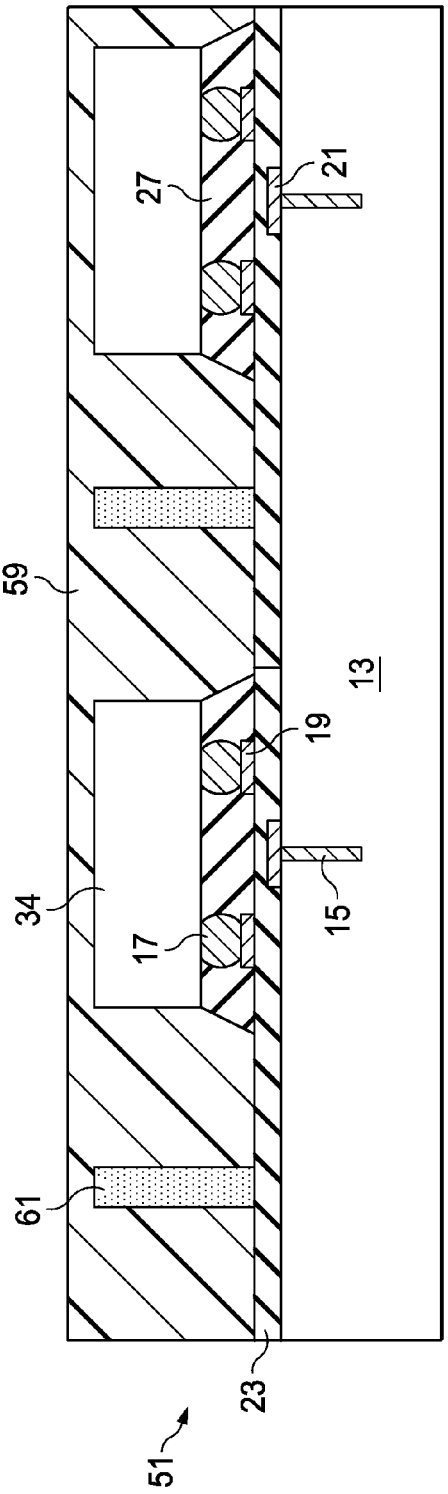
FIG. 6 depicts in a cross-section the assembly of FIG. 5, following additional processing.

FIG. 6 depicts in a cross-section the interposer assembly 51 depicted in FIG. 5, after additional processing is performed. In FIG. 6, compression molding has been performed and mold compound 59 now covers the integrated circuit dies 34, the stress relief features 61, and the die side of substrate 13. The other elements such as substrate 13 and through vias 15 are the same as in FIG. 5 and are not further described here.

FIG. 7 depicts the interposer assembly 51 after some additional process steps are performed. Following the compression molding process, the mold compound 59 and the stress relief features 61 may be cured. The interposer assembly 51 is then processed by a top grinding operation to remove some of the mold compound 59 to expose the top surface of at least the thickest integrated circuit dies 34, to improve thermal performance of the finished assembly. The TSVs 15 are completed by performing a backgrinding operation on the opposite or solder ball side of substrate 13, thinning the silicon wafer substrate 13 to a thickness that is less than 200 microns, or even as little as 100 microns, as described above. However, due to the use of the stress relief features 61, the wafer warp that occurred with the conventional interposers after thinning is reduced or eliminated after the backgrinding and thinning processes.

FIG. 8 depicts the interposer assembly 51 following the solder bumping steps. C4 solder bumps or solder balls 33 are disposed on the opposite or solder ball side of substrate 13, and at least some of these solder bumps couple to TSVs 15. The use of the stress relief features 61 reduces or eliminates the wafer warp that would have occurred in the molding and thinning steps using the conventional approaches, and thus the solder bumping operation is easily performed using conventional vacuum tools, as the wafer warp that prevented processing of the wafers in the prior methods is eliminated. The completed interposer assembly 51 is now ready to be diced into individual assemblies, and the individual assemblies can then be further processed for mounting on a circuit board to complete a system, for example.

FIG. 9 depicts in a cross-section an alternative embodiment assembly 71. In FIG. 9, integrated circuits 34 may be mounted on the die side of substrate 13, which may be a silicon wafer. A molding operation is performed and a mold compound 73 is formed over the integrated circuits 34 on the die side (here shown as the upper side) of substrate 13. Stress relief trenches 75 may be formed into the mold compound by using dicing using a wafer saw, by laser cutting, or by other methods for forming trenches in the mold compound material.

FIG. 10 depicts the interposer assembly embodiment 71 following an additional processing. In FIG. 10, stress relief features 77 are formed when a stress relief material is dispensed into the stress relief trenches 75. The material in stress relief features 77 may be injected, printed, screened or jet dispensed into the trenches. The material is again a material compatible with wafer level processing and packaging, with a relatively high coefficient of thermal expansion (CTE) and low modulus and is a different material than the mold compound 73; so that the stress relief features 77 form breaks in the mold compound matrix and reduce or eliminate wafer warp that would occur if a conventional continuous mold compound matrix were formed.

After the stress release features 77 are formed, the interposer assembly 71 may be subjected to the additional processes to complete the solder bumping of the assembly as described above. Top grinding of the mold compound 73 and the backgrinding operations to thin substrate 13 are performed as described above. Again the wafer warp after the thinning operations are performed is reduced or eliminated by the stress relief features 77, and so the solder bumping operations and any other processes that follow may be easily performed by the vacuum tools; without the problems of the prior known methods.

Figures 11, 12:
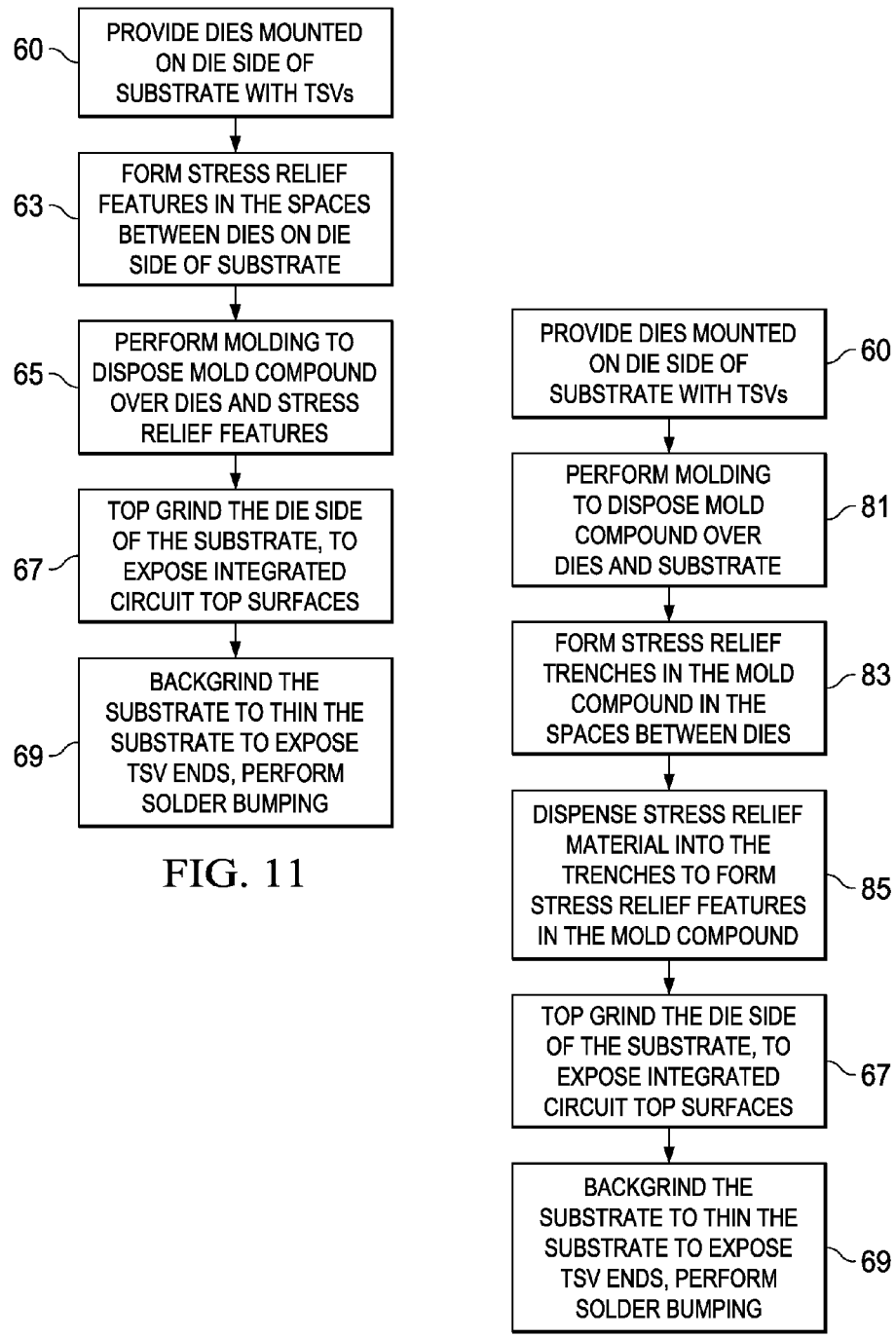
FIG. 11 depicts in a flow diagram an embodiment method.
FIG. 12 depicts in a flow diagram an alternative embodiment method.

FIG. 11 depicts, in a flow chart, a method embodiment using the wafer carrier assembly as described above. In step 60, the substrate is provided with TSVs extending from a die side into the substrate and dies mounted on the die side of the substrate. In step 63, the stress relief features are formed in at least some of the spaces between dies on the die side of the substrate. In step 65, a molding process is performed and the mold compound is disposed over the integrated circuit dies, the stress relief features and the die side of the substrate. A curing operation may be performed, depending on the mold compound and stress relief materials used. In step 67, a top grinding operation is performed to expose the top surface of the thickest integrated circuit dies. In step 69, a backgrinding process is performed to expose the ends of the TSVs on the solder bump side of the substrate, and solder bumping is performed. The substrate may be a silicon wafer and may be thinned to less than 200 microns thickness as described above.

FIG. 12 depicts in a flow diagram the steps for an alternative embodiment method such as depicted in FIGS. 9 and 10 above. In step 60, which is the same as the prior method, the substrate is provided having TSVs extending into the substrate from the die side of the substrate, and the integrated circuits are mounted on the die side of the substrate. In Step 81, molding is performed to dispose the mold compound over the integrated circuit dies and the die side of the substrate. In step 83, trenches are formed in the mold compound for the stress relief features. In step 85, the stress relief materials are dispensed into the trenches. In step 67, which is the same as in the prior method embodiment of FIG. 11, the top grind operation is performed on the die side of the substrate to expose top surfaces of the integrated circuit dies. In step 69, again this is the same as is in the prior method embodiment of FIG. 11, backgrinding is performed to thin the substrate on the solder bump side of the substrate to expose the TSV ends, and solder bumping is performed to complete the method.

In an embodiment, a method comprises receiving an interposer assembly having a die side and an opposite side including two or more integrated circuit dies mounted on the die side of the interposer, the interposer assembly having spaces formed on the die side of the interposer between the two or more integrated circuit dies; mounting at least one stress relief feature on the die side of the interposer assembly in one of the spaces between the two or more integrated circuit dies; and molding the integrated circuit dies using a mold compound, the mold compound surrounding the two or more integrated circuit dies and the at least one stress relief feature. In a further embodiment, the above method is performed and further comprises curing the mold compound to set the mold compound and the at least one stress relief feature. In another method embodiment, the above methods further comprise backgrinding the interposer assembly to thin the interposer from the opposite side. In yet another embodiment, the above methods further comprise receiving a silicon wafer interposer. In a further embodiment, the above methods are performed wherein mounting at least one stress relief feature on the die side of the interposer assembly further comprises dispensing a low modulus material on the die side of the interposer assembly in the spaces between the integrated circuit dies on the die side of the interposer; and performing a pre-cure of the low modulus material; wherein during the encapsulation, the at least one stress relief feature provides a block polymer strip preventing a continuous matrix forming in the mold compound over the integrated circuit dies and the interposer. In yet another embodiment, the above methods further comprise receiving a silicon wafer interposer with one or more through silicon vias (TSVs) extending vertically from the die side of the silicon wafer interposer. In another method embodiment, the above methods continue by curing the mold compound to set the mold compound and the at least one stress relief feature; and backgrinding the interposer assembly to thin the silicon wafer interposer from the opposite side, exposing the through silicon vias at the opposite side. In another embodiment, the above methods are performed wherein the silicon wafer interposer is thinned to a thickness of less than 200 microns. In yet another method, the above methods further comprise forming solder ball connections on the opposite side of the silicon wafer interposer, at least one of the solder ball connections coupled to at least one of the through silicon vias. In another embodiment, the above methods are performed and further comprising curing the mold compound and the at least one stress relief feature; performing a top grind operation on the mold compound and the at least one stress relief feature to expose a top surface of at least one of the integrated circuit dies; and performing a backgrind operation on the opposite side of the interposer, thinning the interposer. In still another method, the above methods are performed wherein the interposer further comprises through silicon vias extending vertically into the interposer from the die side and the backgrind operation exposes the through silicon vias at the opposite side.

In another embodiment, a method is performed comprising forming through silicon vias in a predetermined pattern on a silicon wafer interposer having a die side and an opposite side; mounting a plurality of integrated circuit dies on the die side of the silicon wafer interposer, the integrated circuit dies having gaps between them and defining scribe line areas in at least some of the gaps between them; molding the plurality of integrated circuit dies and the die side of the silicon wafer interposer with a mold compound; dicing the mold compound to form at least one stress relief trench extending into the mold compound in at least one of the gaps between the integrated circuit dies; and dispensing stress relief material different from the mold compound into the at least one stress relief trench to form at least one stress relief feature. In still another embodiment, the above method is performed and further performing a top grind operation on the mold compound until a top surface of at least one of the integrated circuit dies is exposed. In yet another embodiment, the above method is performed and further comprising performing a backgrind operation on the opposite side of the silicon wafer interposer to thin the silicon wafer interposer to a thickness less than 200 microns. In yet another method, the above methods are performed wherein dispensing the stress relief material comprises dispensing liquid resin.

In an embodiment, an apparatus comprises a plurality of integrated circuit dies mounted on a die side surface of a silicon wafer interposer, the integrated circuit dies having gaps between them, the silicon wafer interposer having an opposite side; at least one stress relief feature formed in one of the gaps; and mold compound surrounding the plurality of integrated circuit dies and the at least one stress relief feature. In still another embodiment, the apparatus further comprises a thermosetting plastic mold compound. In still a further embodiment, the apparatus above is provided and the at least one stress relief feature comprises a liquid resin different from the plastic mold compound. In yet another embodiment, the apparatus above is provided and further comprising through silicon vias extending form the die side of the silicon wafer interposer to the opposite side. In still another embodiment, the apparatus above is provided wherein the silicon wafer interposer is thinned to a thickness of less than 200 microns.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method, comprising:
receiving an interposer assembly having a die side and an opposite side including two or more integrated circuit dies mounted on the die side of the interposer assembly, the interposer assembly having spaces between the two or more integrated circuit dies;
mounting at least one stress relief feature on the die side of the interposer assembly in one of the spaces between the two or more integrated circuit dies; and
molding the integrated circuit dies using a mold compound, the mold compound surrounding the two or more integrated circuit dies and the at least one stress relief feature;
wherein the stress relief feature extends through the mold compound from a surface of the interposer assembly on the die side of the interposer assembly to a point coplanar with an upper surface of at least one of the integrated circuit dies.

2. The method of claim 1 and further comprising:
curing the mold compound.

3. The method of claim 2 and further comprising:
backgrinding the interposer assembly to thin the opposite side of the interposer assembly.

4. The method of claim 1, wherein the interposer assembly comprises a silicon wafer interposer.

5. The method of claim 1, wherein mounting at least one stress relief feature on the die side of the interposer assembly further comprises:
dispensing a low modulus material on the die side of the interposer assembly in the spaces between the integrated circuit dies on the die side of the interposer assembly; and
performing a pre-cure of the low modulus material.

6. The method of claim 1 wherein receiving the interposer assembly further comprises receiving a silicon wafer interposer with one or more through silicon vias (TSVs).

7. The method of claim 6, and further comprising:
curing the mold compound to set the mold compound and the at least one stress relief feature; and
backgrinding the interposer assembly to thin the silicon wafer interposer from the opposite side, exposing the through silicon vias at the opposite side.

8. The method of claim 7 wherein the silicon wafer interposer is thinned to a thickness of less than 200 microns.

9. The method of claim 7, and further comprising:
forming solder ball connections on the opposite side of the silicon wafer interposer, at least one of the solder ball connections coupled to at least one of the through silicon vias.

10. The method of claim 1, and further comprising:
curing the mold compound and the at least one stress relief feature;
performing a top grind operation on the mold compound and the at least one stress relief feature to expose a top surface of at least one of the integrated circuit dies; and
performing a backgrind operation on the opposite side of the interposer assembly, thinning the interposer assembly.

11. The method of claim 10, wherein the interposer assembly further comprises through vias extending into the interposer assembly from the die side to the opposite side.

12. An apparatus, comprising:
a plurality of integrated circuit dies mounted on a die side surface of an interposer, the integrated circuit dies having gaps between them, the interposer having an opposite side;
at least one stress relief feature formed in one of the gaps; and
mold compound surrounding the plurality of integrated circuit dies and the at least one stress relief feature;
wherein the at least one stress relief feature extends through the mold compound from the die side surface of the interposer to a point that is coplanar with the upper surface of at least one of the integrated circuit dies.

13. The apparatus of claim 12, wherein the mold compound comprises a thermosetting plastic mold compound.

14. The apparatus of claim 13, wherein the at least one stress relief feature comprises a liquid resin different from the plastic mold compound.

15. The apparatus of claim 12 and further comprising through vias extending form the die side of the interposer to the opposite side.

16. The apparatus of claim 15, wherein the interposer has a thickness of less than 200 microns.

* * * * *